(12) United States Patent  
Takeuchi (10) Patent No.: US 9,166,366 B2  
(45) Date of Patent: Oct. 20, 2015

(54) OPTICAL SEMICONDUCTOR DEVICE AND METHOD FOR MANUFACTURING THE SAME

(71) Applicant: Sumitomo Electric Device Innovations, Inc., Yokohama-shi (JP)

(72) Inventor: Tatsuya Takeuchi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 14/472,215

(22) Filed: Aug. 28, 2014

(65) Prior Publication Data

US 2015/0063391 A1  Mar. 5, 2015

(30) Foreign Application Priority Data

Aug. 29, 2013 (JP) ................................. 2013-178599

(51) Int. Cl.
| | |
|---|---|
| H01S 5/042 | (2006.01) |
| H01S 5/22 | (2006.01) |
| H01S 5/227 | (2006.01) |
| H01S 5/02 | (2006.01) |

(52) U.S. Cl.
CPC ............. *H01S 5/0422* (2013.01); *H01S 5/2205* (2013.01); *H01S 5/0206* (2013.01); *H01S 5/227* (2013.01); *H01S 5/2226* (2013.01); *H01S 5/2275* (2013.01)

(58) Field of Classification Search
CPC ... H01S 5/0206; H01S 5/2081; H01S 5/2086; H01S 5/2205; H01S 5/2206; H01S 5/2207; H01S 5/2209; H01S 5/2226; H01S 5/2227; H01S 5/227; H01S 5/2275
USPC ........................................................ 372/46.01
See application file for complete search history.

(56) References Cited

U.S. PATENT DOCUMENTS 6,323,507 B1 * 11/2001 Yokoyama et al. ............. 257/79  
6,449,298 B1 *  9/2002 Chino et al. ................ 372/45.01

FOREIGN PATENT DOCUMENTS

JP        2011-249767 A      12/2011

* cited by examiner

*Primary Examiner* — Xinning Niu  
(74) *Attorney, Agent, or Firm* — Venable LLP; Michael A. Sartori; Trent B. Ostler

(57) ABSTRACT

An optical semiconductor device has: a semiconductor structure; a mesa structure including the semiconductor structure, a p-type semiconductor layer formed on a plane portion, a first side face and a second side face of the mesa structure, and a high-resistance semiconductor layer burying the mesa structure and the p-type semiconductor layer. The first side face is inclined toward a principal surface of the substrate more than the second side face. The p-type semiconductor layer has a carrier concentration in a portion related to the first side face lower than that of a portion related to the plane portion and the second side face. A distance between a lower end of the active layer and a boundary between the first side face and the second face in a vertical direction to the plane portion is not less than 0.1 μm and not more than 0.5 μm.

15 Claims, 5 Drawing Sheets

OPTICAL SEMICONDUCTOR DEVICE AND METHOD FOR MANUFACTURING THE SAME

BACKGROUND OF THE INVENTION

1. Field of the Invention

The present invention relates to an optical semiconductor device and a method for manufacturing the same.

2. Related Background Art

Japanese Patent Application Laid-Open Publication No. 2011-249767 discloses a semiconductor laser in which a mesa stripe having an active layer is buried in a high-resistance semiconductor layer composed of Fe-containing InP. This semiconductor laser can be formed, for example, by forming the mesa stripe and thereafter burying the mesa stripe in the high-resistance semiconductor layer. In the semiconductor laser of the foregoing Laid-Open Publication No. 2011-249767, a thin-film p-type semiconductor layer is interposed in an early stage of the step of burying the mesa structure (mesa stripe), thereby to suppress leak current flowing out from the active layer to the burying layer and obtain high optical output.

SUMMARY OF THE INVENTION

Problem to be Solved by the Invention

In the semiconductor laser disclosed in the Laid-Open Publication No. 2011-249767, however, the device capacitance was increased by pn junction between a cladding layer of an n-type semiconductor and the high-concentration p-type semiconductor layer formed on side faces of the mesa structure. The increase in device capacitance leads to degradation of characteristics of the optical semiconductor device such as direct modulation of laser light.

An object of the present invention is to provide an optical semiconductor device capable of suppressing the leak current flowing out from the active layer to the burying layer while keeping the device capacitance low, and a method for manufacturing the optical semiconductor device.

An optical semiconductor device according to one aspect of the present invention is an optical semiconductor device comprising: a semiconductor structure formed on a n-type substrate, the semiconductor structure having an n-type cladding layer, an active layer, and a p-type cladding layer; a mesa structure including the semiconductor structure, and having a plane portion, a first side face continued to the plane portion and a second side face continued to the first side face; a p-type semiconductor layer formed on the plane portion, the first side face and the second side face; and a high-resistance semiconductor layer having deep acceptor level to bury the mesa structure and the p-type semiconductor layer, wherein the first side face is inclined toward a principal surface of the substrate more than the second side face, wherein the p-type semiconductor layer has a carrier concentration in a portion related to the first side face lower than that of a portion related to the plane portion and the second side face, and wherein a distance between a lower end of the active layer and a boundary between the first side face and the second face in a vertical direction to the plane portion is not less than 0.1 µm and not more than 0.5 µm.

A manufacturing method of optical semiconductor device according to one aspect of the present invention is a method for manufacturing an optical semiconductor device, the method comprising: (a) forming a semiconductor structure on a n-type substrate, the semiconductor structure having an n-type cladding layer, an active layer, and a p-type cladding layer; (b) forming a mesa structure to the semiconductor structure and the substrate, the mesa structure having a plane portion, a first side face continued to the plane portion and a second side face continued to the first side face; (c) forming a p-type semiconductor layer on the plane portion, the first side face and the second side face; (d) forming a high-resistance semiconductor layer having deep level acceptor to bury the mesa structure and the p-type semiconductor layer, wherein the first side face is inclined toward a principal surface of the substrate more than the second side face, wherein the p-type semiconductor layer has a carrier concentration in a portion related to the first side face lower than that of a portion related to the plane portion and the second side face, and wherein a distance between a lower end of the active layer and a boundary between the first side face and the second face in a vertical direction to the plane portion is not less than 0.1 µm and not more than 0.5 µm.

The present invention successfully provides the optical semiconductor device capable of suppressing the leak current flowing out from the active layer to the burying layer while keeping the device capacitance low, and the method for manufacturing the optical semiconductor device.

BRIEF DESCRIPTION OF THE DRAWINGS

Part a of FIG. 1 is a cross-sectional view illustrating a semiconductor device according to the first embodiment and Part b of FIG. 1 is a perspective view illustrating the semiconductor device according to the first embodiment.

Part a to Part c of FIG. 3 are drawings showing cross sections illustrating a method for manufacturing the semiconductor laser according to the first embodiment.

Part a to Part C of FIG. 4 are cross-sectional views illustrating the method for manufacturing the semiconductor laser according to the first embodiment.

DETAILED DESCRIPTION OF THE PREFERRED EMBODIMENTS

Description of Embodiments of the Present Invention

First, the contents of embodiments of the present invention will be described as enumerated below. An optical semiconductor device according to one embodiment of the present invention is an optical semiconductor device comprising: a semiconductor structure formed on a n-type substrate, the semiconductor structure having an n-type cladding layer, an active layer, and a p-type cladding layer; a mesa structure including the semiconductor structure, and having a plane portion, a first side face continued to the plane portion and a second side face continued to the first side face; a p-type semiconductor layer formed on the plane portion, the first side face and the second side face; and a high-resistance semiconductor layer having deep acceptor level to bury the mesa structure and the p-type semiconductor layer, wherein the first side face is inclined toward a principal surface of the substrate more than the second side face, wherein the p-type semiconductor layer has a carrier concentration in a portion related to the first side face lower than that of a portion related to the plane portion and the second side face, and wherein a distance between a lower end of the active layer and a boundary between the first side face and the second face in a vertical direction to the plane portion is not less than 0.1 μm and not more than 0.5 μm.

In the optical semiconductor device according to the above embodiment, the angle to the principal surface of the substrate, of at least the part of the first side face may be not less than 38° and not more than 78° and the angle to the principal surface of the substrate, of the second side face may be not less than 80° and not more than 115°.

In the optical semiconductor device according to the above embodiment, the substrate may be composed of InP, the p-type semiconductor layer may be InP, or any one of InGaAs, InGaAsP, InAlAs, InAlAsP, InAlGaAs, and InAlGaAsP lattice-matched with InP, and the p-type dopant of the p-type semiconductor layer may be Zn, Mg, or Be.

In the optical semiconductor device according to the above embodiment, the high-resistance semiconductor may be doped with an impurity such as Fe (iron), Ti (titanium) to form a deep acceptor level, that is composed of InP.

The optical semiconductor device according to the above embodiment may further comprise a n-type block layer provided on the high-resistance semiconductor layer.

In the optical semiconductor device according to the above embodiment, the n-type block layer may be doped with sulfur, that is composed of InP.

In the optical semiconductor device according to the above embodiment, the principal surface of the substrate may be a (100) plane ±1°.

A manufacturing method of optical semiconductor device according to one embodiment of the present invention is a method for manufacturing an optical semiconductor device, the method comprising: (a) forming a semiconductor structure on a n-type substrate, the semiconductor structure having an n-type cladding layer, an active layer, and a p-type cladding layer; (b) forming a mesa structure to the semiconductor structure and the substrate, the mesa structure having a plane portion, a first side face continued to the plane portion and a second side face continued to the first side face; (c) forming a p-type semiconductor layer on the plane portion, the first side face and the second side face; (d) forming a high-resistance semiconductor layer having deep level acceptor to bury the mesa structure and the p-type semiconductor layer, wherein the first side face is inclined toward a principal surface of the substrate more than the second side face, wherein the p-type semiconductor layer has a carrier concentration in a portion related to the first side face lower than that of a portion related to the plane portion and the second side face, and wherein a distance between a lower end of the active layer and a boundary between the first side face and the second face in a vertical direction to the plane portion is not less than 0.1 μm and not more than 0.5 μm.

In the manufacturing method of optical semiconductor device according to the above embodiment, the step (b) may include a step of carrying out a thermal treatment for the mesa structure.

In the manufacturing method of optical semiconductor device according to the above embodiment, the step (b) includes a step of carrying out an etching process for the mesa structure.

In the manufacturing method of optical semiconductor device according to the above embodiment, the angle to the principal surface of the substrate, of at least the part of the first side face may be not less than 38° and not more than 78° and the angle to the principal surface of the substrate, of the second side face may be not less than 80° and not more than 115°.

The manufacturing method of optical semiconductor device according to the above embodiment may further comprise forming a n-type block layer for burying the mesa structure, on the high-resistance semiconductor layer.

In the manufacturing method of optical semiconductor device according to the above embodiment, the n-type block layer may be composed of a n-type InP doped with sulfur.

In the manufacturing method of optical semiconductor device according to the above embodiment, the etching process may include a dry etching process and a wet etching process, the wet etching process being performed after the dry etching process.

Details of Embodiments of the Present Invention

Embodiments of the present invention will be described below.

First Embodiment

Figure 1:
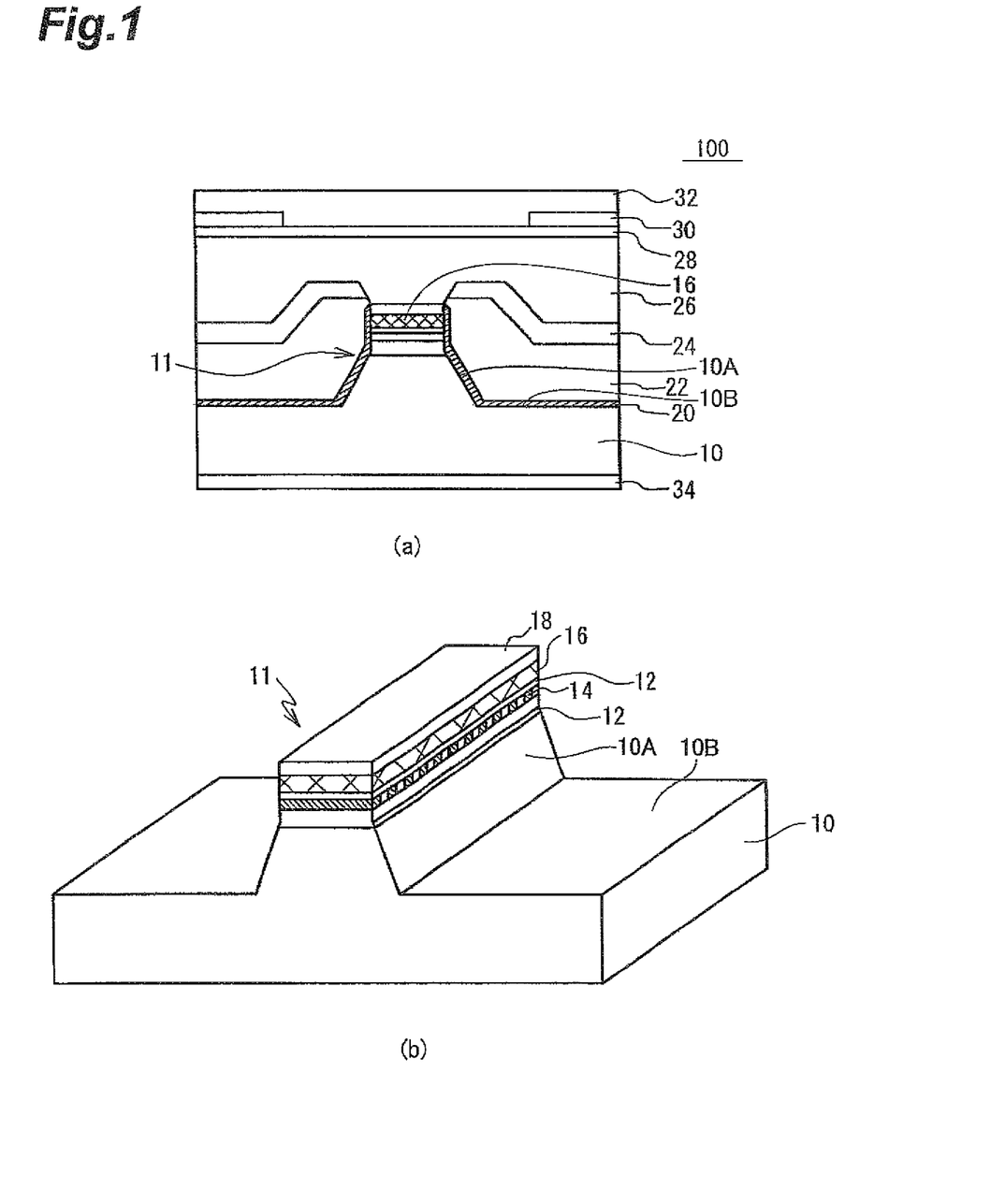

Part a of FIG. 1 is a drawing showing a cross section illustrating a semiconductor laser 100 (optical semiconductor device) according to the first embodiment, which is a view of the semiconductor laser from a propagation direction of laser light. An active layer 16 is crosshatched. Hatching is omitted for the portions other than the active layer 16 and p-type semiconductor layer 20. Part b of FIG. 1 is a perspective view showing an enlargement of mesa stripe 11.

As shown in Parts a and b of FIG. 1, an n-type InP substrate 10 has a mesa side face 10A and a principal surface 10B. The mesa stripe 11 is formed as a part of a mesa structure on the principal surface 10B of the n-type InP substrate 10. The principal surface 10B is a surface of a (100) plane ±1° of n-type InP. Namely, the principal surface 10B is the (100) plane of n-type InP or, a surface inclined within 1° to any direction from the (100) plane of n-type InP. As shown in Part a of FIG. 1, a thin-film p-type semiconductor layer 20 is formed from side faces on both sides of the mesa stripe 11 onto the region other than the mesa stripe 11 in the n-type InP substrate 10. More specifically, the p-type semiconductor layer 20 is provided across a range from each side face of the mesa stripe 11 to a plane portion of the mesa structure. In this embodiment, the plane portion of the mesa structure is a part of the principal surface 10B of the n-type InP substrate 10. The p-type semiconductor layer 20 is in contact with the principal surface 10B of the n-type InP substrate 10 and with the side faces of the mesa stripe 11. The mesa stripe 11 is buried in a high-resistance semiconductor layer 22, an n-type InP block layer 24, and a p-type cladding layer 26. The high-resistance semiconductor layer 22 and n-type InP block layer 24 are formed so as to bury the both sides of the mesa stripe 11. The p-type cladding layer 26 is formed on the mesa stripe 11 and the n-type InP block layer 24, thereby burying the mesa stripe 11. A contact layer 28 is formed on the p-type cladding layer 26. A protecting film 30 is formed on the contact layer 28 excluding a region above the mesa stripe 11. A p-type electrode 32 is formed so as to cover an exposed region of the contact layer 28 and the protecting film 30. Furthermore, an n-type electrode 34 is formed on a bottom surface of the n-type InP substrate 10.

As shown in Part b of FIG. 1, the mesa stripe 11 includes an n-type cladding layer 12, an InGaAsP layer (indium gallium arsenic phosphorus) layer 14, an active layer 16, and a p-type cladding layer 18. The InGaAsP layer 14 in Part b of FIG. 1 is hatched. The InGaAsP layer 14 of an island shape buried in the n-type cladding layer 12 functions as a diffraction grating.

Figure 2:
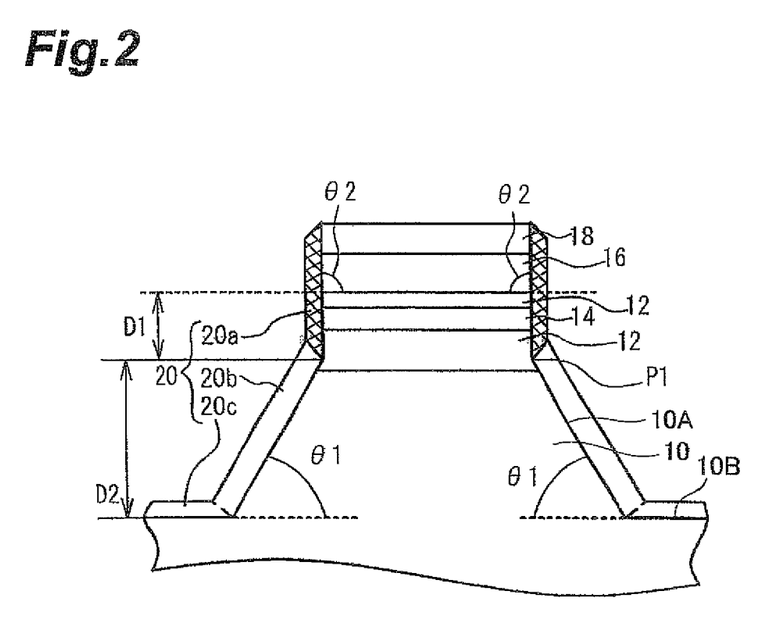
FIG. 2 is a schematic view showing an enlargement of a mesa stripe.

FIG. 2 is a schematic view showing an enlargement of the mesa stripe 11. Dotted lines (broken lines) indicate the plane direction of the principal surface 10B of the n-type InP substrate 10. As shown in FIG. 2, an angle to the principal surface 10B of the n-type InP substrate 10, of each side face (first side face) of the n-type InP substrate 10 and a part of the n-type cladding layer 12 in the mesa stripe 11 is θ1. The first side face is a part of each side face of the mesa stripe 11 and part defined by a portion below the active layer 16 in the mesa stripe 11 (the portion corresponds to a part of the n-type InP substrate 10 and the n-type cladding layer 12 in the present embodiment). An angle to the principal surface 10B of the n-type InP substrate 10, of each side face (second side face) of the active layer 16 in the mesa stripe 11 is θ2. The second side face is a part of each side face of the mesa stripe 11 and part defined by the active layer 16 in the mesa stripe 11. The second side face may be a part of each side face of the mesa stripe 11 and part defined by a portion including the active layer 16 in the mesa stripe 11. The angle θ1 is not less than 38° and not more than 78°. The angle θ2 is not less than 80° and not more than 115°. A part of the mesa stripe 11 where the angle to the principal surface 10B changes is denoted by P1. Namely, the part P1 represents a boundary portion between the first side face and the second side face. A distance D1 from the active layer 16 to the part P1 is 0.25 μm and a distance D2 from the top surface of the n-type InP substrate 10 to the part P1 is 1.3 μm.

The p-type semiconductor layer 20 includes regions 20a, 20b, and 20c of different dopant concentrations. The region 20a is a crosshatched portion on each of the side faces (mesa side faces) of the mesa stripe 11 in FIG. 2, the region 20b is a blank portion on each mesa side face, and the region 20c is a blank portion on the principal surface 10B of the n-type InP substrate 10. Efficiency of incorporation of a dopant during growth of the p-type semiconductor layer 20 varies depending upon the angles to the principal surface 10B of the n-type InP substrate 10, of the side faces of the mesa stripe 11. For this reason, the low-dopant-concentration regions 20b and 20c are formed from the principal surface 10B of the n-type InP substrate 10 to a part of the n-type cladding layer 12 in the mesa stripe 11. The high-dopant-concentration region 20a is formed on each of both sides of the active layer 16.

The n-type InP substrate 10 is composed of n-type InP containing an n-type impurity in a concentration in the range of $5.0\times10^{17}/cm^3$ to $4.0\times10^{19}/cm^3$ and, as an example, it is composed of n-type InP doped with Sn (tin) in a concentration of $1.0\times10^{18}/cm^3$. The n-type cladding layer 12, as an example, is composed of 0.5-μm-thick n-type InP doped with Si (silicon) in a concentration of $1.0\times10^{18}/cm^3$. The active layer 16, as an example, has a multi-quantum well (MQW) structure including layers composed of GaAlInAs. There are no particular restrictions on a combination of wells and barriers of the MQW structure, but it has, for example, a composition such as $Ga_{0.1}Al_{0.2}In_{0.7}As$ (barriers). The p-type cladding layer 18, as an example, is composed of 0.2-μm-thick p-type InP doped with Zn (zinc) in a concentration of $1.0\times10^{18}/cm^3$.

The thickness of the p-type semiconductor layer 20 on the region other than the mesa stripe 11 in the n-type InP substrate 10 is from 5 nm to 45 nm. More specifically, the thickness of the p-type semiconductor layer 20 on the plane portion of the mesa structure (in this embodiment, on a part of the principal surface 10B of the n-type InP substrate 10) (i.e., the thickness of the region 20c) is from 5 nm to 45 nm. The p-type semiconductor layer 20 is composed of a p-type semiconductor lattice-matched with the n-type InP substrate 10 and, as an example, it is composed of p-type InP doped with Zn (zinc). Furthermore, the p-type semiconductor layer 20 may be made using any one of p-type InGaAs, p-type InGaAsP, p-type InAlAs, p-type InAlAsP, p-type InAlGaAs, and p-type InAl-GaAsP lattice-matched with InP. A p-type dopant also applicable herein can be Mg (magnesium) or Be (beryllium).

The high-resistance semiconductor layer 22 is doped with an impurity such as Fe (iron), Ti (titanium) to form a deep acceptor level. For example, the high-resistance semiconductor layer 22, as an example, is composed of 1.4-μm-thick InP doped with Fe in a concentration of $7.0\times10^{16}/cm^3$. Furthermore, the n-type InP block layer 24, as an example, is composed of 0.4-μm-thick n-type InP doped with S (sulfur) in a concentration of $1.0\times10^{19}/cm^3$. The p-type cladding layer 26, as an example, is composed of 2.0-μm-thick p-type InP doped with Zn in a concentration of $1.2\times10^{18}/cm^3$. The contact layer 28 is composed of a material with a smaller bandgap than that of the p-type cladding layer 26 and, as an example, it is composed of 0.5-μm-thick p-type InGaAs doped with Zn (zinc) in a concentration of $1.2\times10^{19}/cm^3$. The protecting film 30 is composed of an insulator such as $SiO_2$. The p-type electrode 32, as an example, is composed of a multilayer body of Ti, Pt (platinum), and Au (gold). The n-type electrode 34, as an example, is composed of a multilayer body of Au, Ge (germanium), and Ni (nickel).

Figure 3:
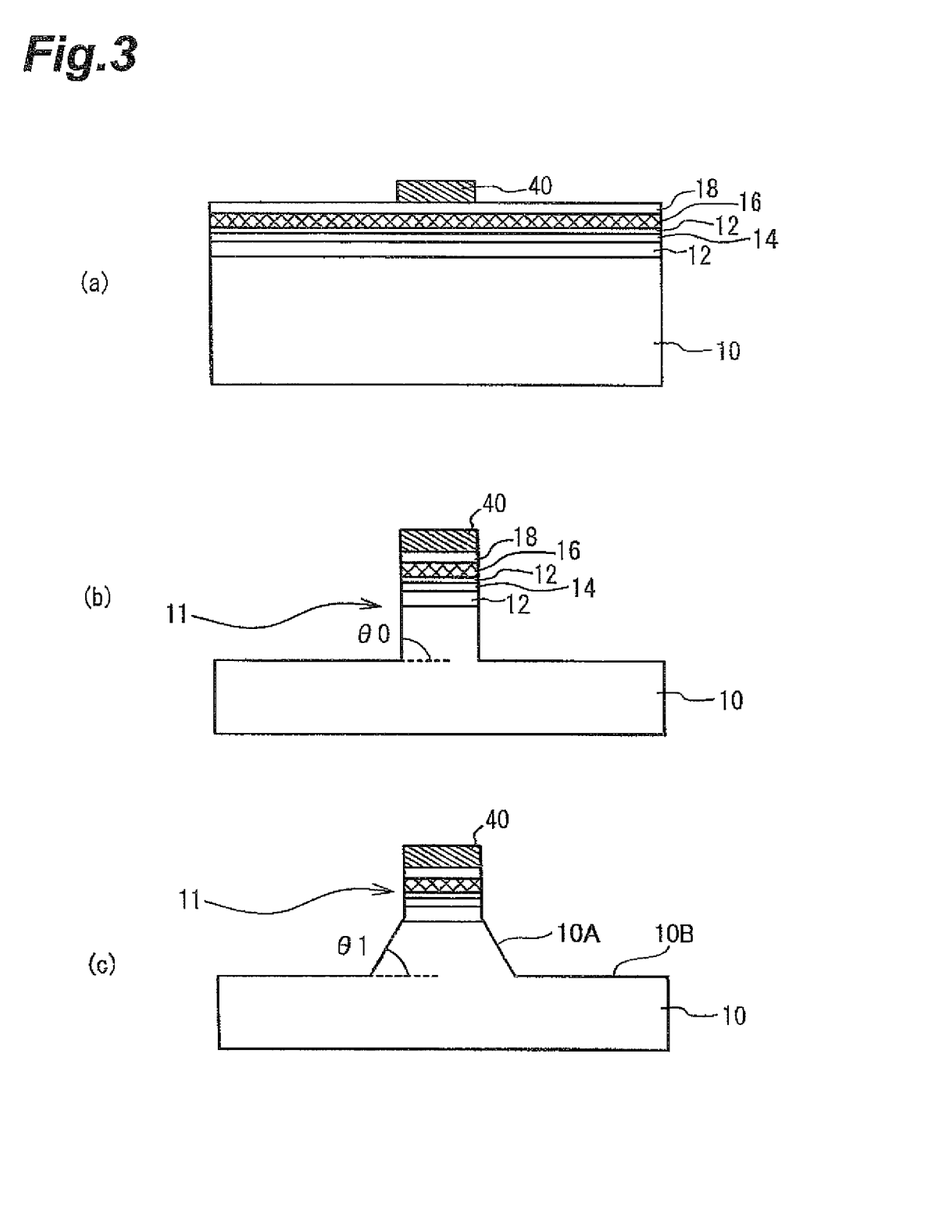
Figure 4:
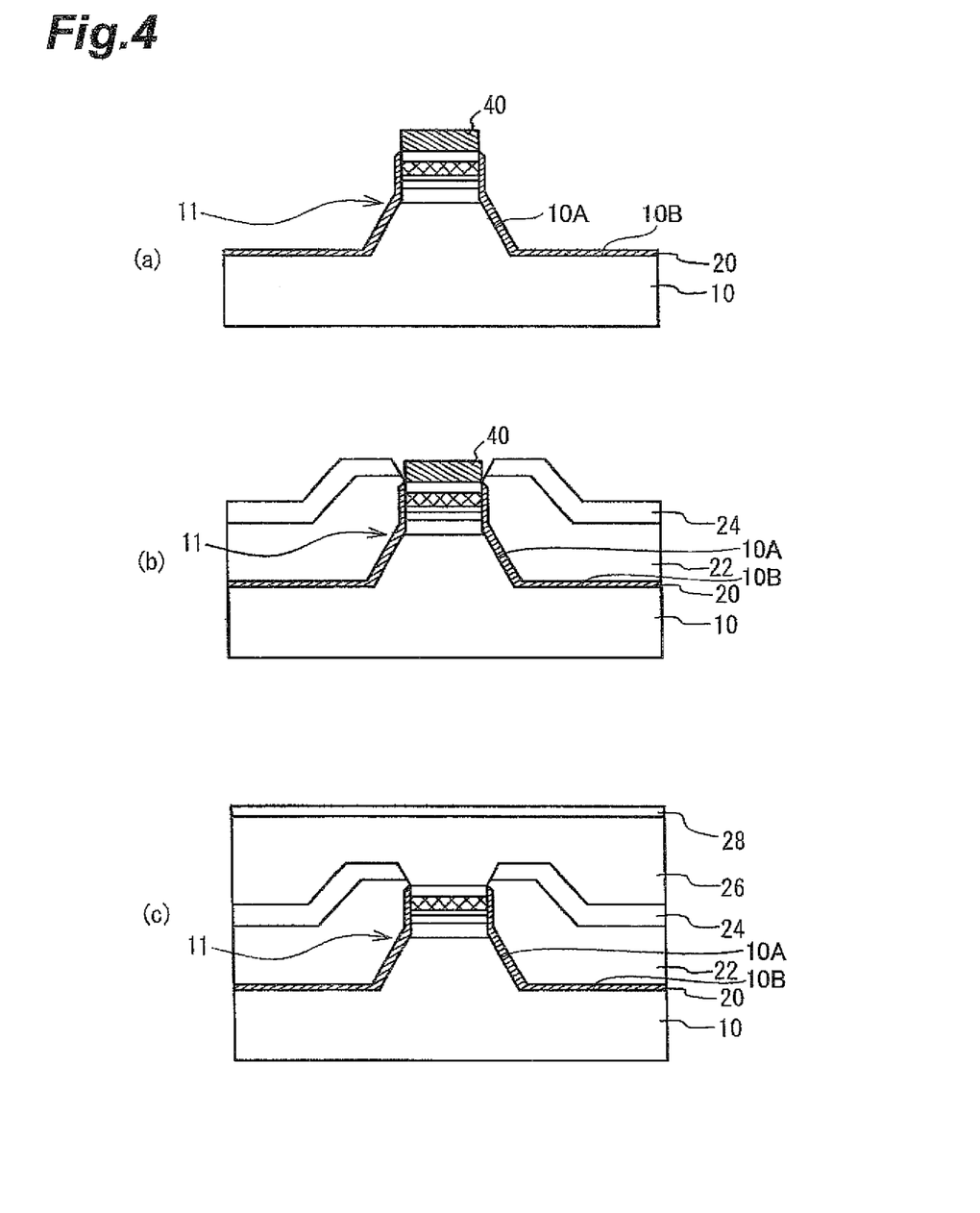

Part a of FIG. 3 to Part c of FIG. 4 are drawings showing cross sections illustrating a method for manufacturing the semiconductor laser 100 according to the first embodiment. In the present manufacturing method, first, the n-type cladding layer 12, InGaAsP layer 14, active layer 16, and p-type cladding layer 18 are grown on the principal surface of the n-type InP substrate 10, as shown in Part a of FIG. 3. Next, a mask 40 is formed in a stripe shape on the region where the mesa stripe 11 extending in the [011] direction is to be formed, on the p-type cladding layer 18. The mask 40, as an example, is composed of 0.5-μm-thick $SiO_2$.

Next, as shown in Part b of FIG. 3, a dry etching process using the mask 40 as an etching mask is carried out for partial areas of the p-type cladding layer 18, active layer 16, n-type cladding layer 12, InGaAsP layer 14, and n-type InP substrate 10. It results in forming the mesa stripe 11 on the n-type InP substrate 10. Namely, the dry etching process forms the n-type InP substrate 10 having the mesa side face 10A and the principal surface 10B and also forms the mesa stripe 11 on the principal surface 10B of the n-type InP substrate 10. The foregoing dry etching process to be applied herein can be, for example, an RIE (Reactive Ion Etching) process using $SiCl_4$ as etching gas. The height of the mesa stripe 11 except for the mask 40 is 2.0 μm, as an example. An angle θ0 to the principal surface of the n-type InP substrate 10, of each side face of the mesa stripe 11 is, for example, 94°. After formation of the mesa stripe 11, wet etching is carried out, for example, for removing damage due to the dry etching. This wet etching results in increasing the angle θ0.

Next, as shown in Part c of FIG. 3, the angle to the principal surface 10B of the n-type InP substrate 10, of each side face of the mesa stripe 11 is decreased. The mesa stripe 11 is subjected to a thermal treatment. Specifically, the thermal treatment for the mesa stripe 11 is carried out so as to make the angle to the principal surface 10B of the n-type InP substrate 10, of the side face defined by the portion below the active layer 16 in the mesa stripe 11, in each side face of the mesa stripe 11, smaller than the angle to the principal surface 10B of the n-type InP substrate 10, of the side face defined by a portion including the active layer 16 (for example, by only the active layer 16), in each side face of the mesa stripe 11. Conditions for the thermal treatment are, for example, the following conditions.

Pressure: 85.0 Torr
Gas: hydrogen atmosphere and a small amount of phosphine ($PH_3$)
Partial pressure of phosphine ($PH_3$): 2.8 Torr
Temperature: 650° C.-670° C.
Time: 10 minutes to 20 minutes The thermal treatment is carried out under the above conditions, thereby to make the mesa stripe 11 in a taper shape. In the above state, phosphorus (P), which is surface atoms of the n-type InP substrate 10, migrates to grow on the bottom part of the mesa stripe 11, thereby forming the taper shape. This treatment results in establishing the angles θ1 and θ2.

Next, as shown in Part a of FIG. 4, the thin-film p-type semiconductor layer 20 is grown from the side faces on both sides of the mesa stripe 11 onto the region other than the mesa stripe 11 in the n-type InP substrate 10. Namely, the p-type semiconductor layer 20 is grown across a range from the side faces of the mesa stripe 11 to the plane portion (in this embodiment, a part of the principal surface 10B) of the mesa structure. Then, as shown in Part b of FIG. 4, the high-resistance semiconductor layer 22 and n-type InP block layer 24 are successively grown so as to bury the two sides of the mesa stripe 11, on the p-type semiconductor layer 20.

Next, as shown in Part c of FIG. 4, the mask 40 is removed using HF (hydrofluoric acid) or the like. The p-type cladding layer 26 is then grown so as to cover the top surfaces of the p-type cladding layer 18 and the n-type InP block layer 24. Furthermore, the contact layer 28 is grown on the p-type cladding layer 26. It is noted that the p-type cladding layers 18 and 26 function as one cladding layer.

Next, the protecting film 30 is formed on the contact layer 28 excluding the region above the mesa stripe 11 and the p-type electrode 32 is formed so as to cover the exposed region of the contact layer 28 and the protecting film 30. The n-type electrode 34 is formed on the bottom surface of the n-type InP substrate 10. The semiconductor laser 100 of the present embodiment shown in Part a of FIG. 1 is formed through the above-described steps.

The MOVPE (Metal-Organic Vapor Phase Epitaxy) process can be used for growth of each of the above-described semiconductor layers. The growth temperature can be set at about 620° C. Furthermore, raw materials to be used for InP can be trimethyl indium and phosphine. Doping with Zn (zinc) can be implemented using dimethyl zinc. Doping with Fe (iron) can be implemented using ferrocene. Doping with S (sulfur) can be implemented using hydrogen sulfide. Doping with Si (silicon) can be implemented using disilane.

Figure 5:
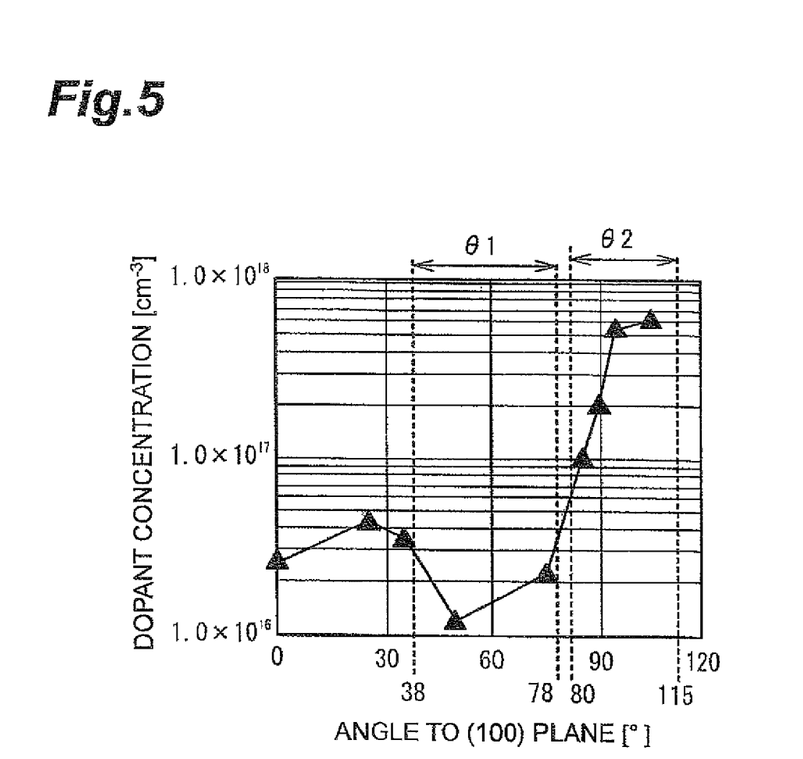
FIG. 5 is a drawing showing plane-direction dependence of dopant concentration.

FIG. 5 is a drawing showing the plane-direction dependence of dopant concentration. The horizontal axis represents angles of the side faces of the mesa stripe 11 to the (100) plane and the vertical axis dopant concentrations (Zn concentrations) of the p-type semiconductor layer 20. As shown in FIG. 5, the dopant concentrations in the range of angles to the (100) plane from 38° to 78° (corresponding to the angle θ1 shown in FIG. 2) are from 45% to 110% of the concentration on the (100) plane, which are approximately equal to or smaller than the concentration on the (100) plane. The dopant concentrations in the range of angles from 80° to 115° (corresponding to the angle θ2) are larger than the concentration on the (100) plane, i.e., 150% to 200% of the concentration on the (100) plane. Because of this plane-direction dependence, the region 20b with the low dopant concentration is formed on the portion with the angle θ1 and the region 20a with the high dopant concentration is formed on the portion with the angle θ2, in each side face of the mesa stripe 11.

Since the region 20b with the low dopant concentration is formed, it decreases the capacitance due to the pn junction between the n-type cladding layer 12 and the p-type semiconductor layer 20. The decrease of the pn junction capacitance in the region 20b leads to decrease of device capacitance, thereby achieving improvement in modulation characteristic of laser. Since the region 20a with the high dopant concentration is formed, it suppresses leakage of electrons from the active layer 16 to the high-resistance semiconductor layer 22, thereby allowing acquisition of high optical output. As described above, the semiconductor laser 100 of the first embodiment is configured to be capable of suppressing the leak current flowing out from the active layer 16 to the high-resistance semiconductor layer 22, while keeping the device capacitance low.

In the case where the p-type dopant is Zn (zinc) in the p-type semiconductor layer (region 20c) on the principal surface 10B of the n-type InP substrate 10, the product of the dopant concentration and the thickness of the p-type semiconductor layer 20 is set to not more than $2.5 \times 10^{19}$ nm/cm$^3$, whereby the depletion layer of the pn junction between the n-type InP substrate 10 and the p-type semiconductor layer 20 can be fully extended up to the high-resistance semiconductor layer 22. Furthermore, in the case where the p-type dopant of the p-type semiconductor layer 20 is Zn (zinc), the dopant concentration of the p-type semiconductor layer 20 on the principal surface 10B of the n-type InP substrate 10 is set in the range of $1.0 \times 10^{17}$/cm$^3$ to $1.5 \times 10^{18}$/cm$^3$, whereby the depletion layer of the pn junction between the n-type InP substrate 10 and the p-type semiconductor layer 20 can be fully extended up to the high-resistance semiconductor layer 22. For the above reason, it is feasible to suppress the pn junction capacitance between the n-type InP substrate 10 and the p-type semiconductor layer 20 on the principal surface 10B of the n-type InP substrate 10.

When the thickness of the p-type semiconductor layer 20 is set sufficiently small, it is feasible to reduce the device capacitance inevitably occurring in formation of the p-type semiconductor layer 20. It is noted that the p-type semiconductor layer 20 preferably has the thickness in the range of 5 nm to 45 nm and more preferably has the thickness in the range of 5 nm to 30 nm. A decrease of the thickness of the p-type semiconductor layer 20 means a decrease of the thickness of an inhibition layer for suppression of leak current. According to the first embodiment, the region 20a with the high dopant concentration can be formed in the p-type semiconductor layer 20 by making use of the plane-direction dependence of p-type dopant incorporation efficiency. Therefore, the leak current can be suppressed even if the thickness of the inhibition layer is small.

In the first embodiment, the region of the mesa stripe 11 in contact with the principal surface 10B, i.e., the portion rising from the principal surface 10B of the n-type InP substrate 10 has the angle θ1. In each side face of the mesa stripe 11, at least a partial side face of the region below the active layer 16 needs to have the angle θ1 and the side face of the active layer 16 needs to have the angle 82. For example, in the mesa stripe 11, the side face of the n-type InP substrate 10 may have the angle θ1 and the side face of the n-type cladding layer 12 and the active layer 16 may have the angle 82. Furthermore, the mesa stripe 11 may have the angle θ1 in its side face ranging from the n-type InP substrate 10 to the bottom surface of the InGaAsP layer 14.

The angle θ1 may be, for example, not less than 25°, not less than 30°, not more than 60°, and not more than 70°. The angle θ2 may be, for example, not less than 85°, not less than 90°, not more than 100°, and not more than 120°. As shown in FIG. 5, the dopant concentration around 30° becomes higher than that at 0°. Therefore, θ1 is preferably not less than 38°. As shown in FIG. 5, when θ1 is set in the range of 38° to 78° and θ2 in the range of 80° to 115°, the dopant concentration of the region 20a becomes approximately 10 times the dopant concentration of the region 20b. The position P1 (a boundary portion between the first side face and the second side face) where the angle of the side faces of the mesa stripe 11 to the principal surface 10B varies is located so as to be not less than 0.1 μm and not more than 0.5 μm away from the lower end of the active layer 16. When the height from the principal surface 10B of the n-type InP substrate 10 to the bottom surface of the active layer 16 is 1.6 μm and the position P1 is 0.1 μm away from the lower end of the active layer 16, 94% of each mesa side face below the active layer 16 corresponds to θ1. When the position P1 is 0.5 μm away from the lower end of the active layer 16, 69% of each mesa side face below the active layer 16 corresponds to θ1. Stable control on the position of P1 is accompanied by manufacturing difficulties, but the position P1 is desirably set as close to the lower end of the active layer 16 as possible, in order to reduce the device capacitance. The position P1 may be located not less than 0.2 μm, not more than 0.3 μm, not more than 0.4 μm, or not more than 0.6 μm away from the lower end of the active layer 16.

Second Embodiment

The semiconductor laser according to the second embodiment has the configuration shown in Parts a and b of FIG. 1. As described below, a method for manufacturing the semiconductor laser according to the second embodiment is different in part from that according to the first embodiment. The steps shown in Part a of FIG. 3 and Part a to Part c of FIG. 4 in the manufacturing method of the semiconductor laser according to the first embodiment are also carried out in the manufacturing method of the semiconductor laser according to the second embodiment. The thermal treatment shown in Part c of FIG. 3 is not carried out in the second embodiment. The angles θ1 and θ2 are made by changing the etching conditions for the dry etching for formation of the mesa stripe 11 in Part b of FIG. 3. Namely, the etching conditions in execution of the step shown in Part b if FIG. 3 are selected so as to make the angle θ1 to the principal surface 10B, of at least a part of the first side face defined by the portion below the active layer 16 in the mesa stripe 11, in each side face of the mesa stripe 11, smaller than the angle θ2 to the principal surface 10B of the base portion 10B, of the second side face defined by a portion including the active layer 16, in each side face of the mesa stripe 11, immediately after the end of the step. For this reason, immediately after the step shown in Part b of FIG. 3, the mesa stripe 11 has the shape shown in Part c of FIG. 3. The conditions for etching include, for example, mask shape, substrate temperature, pressure, antenna power, bias power, and so on. The p-type semiconductor layer 20 is formed across a range from the side faces of the mesa stripe 11 with the angles θ1 and θ2 formed as described above, to the plane portion of the mesa structure (in this embodiment, to a part of the principal surface 10B of the n-type InP substrate 10). This forms the regions 20a, 20b, and 20c as shown in FIG. 2. The second embodiment can also suppress the leak current while keeping the device capacitance low, as the first embodiment.

Each of the above embodiments illustrated the semiconductor laser as an example of the optical semiconductor device according to the present invention, but the present invention does not have to be limited to it. For example, the present invention may be applied to other optical semiconductor devices such as semiconductor optical amplifier (SOA).

It should be noted that the present invention is by no means intended to be limited to the specific embodiments and examples and can be modified or changed in many ways, without departing from the scope of the gist of the present invention described in the scope of claims.

What is claimed is:

1. An optical semiconductor device comprising:
    a semiconductor structure formed on a n-type substrate, the semiconductor structure having an n-type cladding layer, an active layer, and a p-type cladding layer;
    a mesa structure including the semiconductor structure, and having a plane portion, a first side face continued to the plane portion and a second side face continued to the first side face;
    a p-type semiconductor layer formed on the plane portion, the first side face and the second side face; and
    a high-resistance semiconductor layer having deep acceptor level to bury the mesa structure and the p-type semiconductor layer,
    wherein the first side face is inclined toward a principal surface of the substrate more than the second side face,
    wherein the p-type semiconductor layer has a carrier concentration in a portion related to the plane portion and the first side face lower than that of a portion related to the second side face, and
    wherein a distance between a lower end of the active layer and a boundary between the first side face and the second face in a vertical direction to the plane portion is not less than 0.1 μm and not more than 0.5 μm,
    wherein on the plane portion, a product of the thickness of the p-type semiconductor layer and a concentration of a p-type dopant of the p-type semiconductor layer is not more than $2.5 \times 10^{19}$ nm/cm$^3$, and
    wherein the p-type semiconductor layer has a thickness in the range of 5 nm to 45 nm on the plane portion.

2. The optical semiconductor device according to claim 1, wherein the angle to the principal surface of the substrate, of at least the part of the first side face is not less than 38° and not more than 78° and wherein the angle to the principal surface of the substrate, of the second side face is not less than 80° and not more than 115°.

3. The optical semiconductor device according to claim 1, wherein the substrate is composed of InP, wherein the p-type semiconductor layer is InP, or any one of InGaAs, InGaAsP, InAlAs, InAlAsP, InAlGaAs, and InAlGaAsP lattice-matched with InP, and wherein the p-type dopant of the p-type semiconductor layer is Zn, Mg, or Be.

4. The optical semiconductor device according to claim 1, wherein the high-resistance semiconductor is doped with an impurity such as Fe (iron), Ti (titanium) to form a deep acceptor level, that is composed of InP.

5. The optical semiconductor device according to claim 1, further comprising a n-type block layer provided on the high-resistance semiconductor layer.

6. The optical semiconductor device according to claim 5, wherein the n-type block layer is doped with sulfur, that is composed of InP.

7. The optical semiconductor device according to claim 1, wherein the principal surface of the substrate is a (100) plane ±1°.

8. A method for manufacturing an optical semiconductor device, the method comprising:
    (a) forming a semiconductor structure on a n-type substrate, the semiconductor structure having an n-type cladding layer, an active layer, and a p-type cladding layer;
    (b) forming a mesa structure to the semiconductor structure and the substrate, the mesa structure having a plane portion, a first side face continued to the plane portion and a second side face continued to the first side face;
    (c) forming a p-type semiconductor layer on the plane portion, the first side face and the second side face;

(d) forming a high-resistance semiconductor layer having deep level acceptor to bury the mesa structure and the p-type semiconductor layer, wherein the first side face is inclined toward a principal surface of the substrate more than the second side face, wherein the p-type semiconductor layer has a carrier concentration in a portion related to the plane portion and the first side face lower than that of a portion related to the second side face;

wherein a distance between a lower end of the active layer and a boundary between the first side face and the second face in a vertical direction to the plane portion is not less than 0.1 μm and not more than 0.5 μm, wherein on the plane portion, a product of the thickness of the p-type semiconductor layer and a concentration of a p-type dopant of the p-type semiconductor layer is not more than $2.5 \times 10^{19}$ nm/cm$^3$, and wherein the p-type semiconductor layer has a thickness in the range of 5 nm to 45 nm on the plane portion.

9. The method for manufacturing an optical semiconductor device according to claim 8, wherein the step (b) includes a step of carrying out a thermal treatment for the mesa structure.

10. The method for manufacturing an optical semiconductor device according to claim 8, wherein the step (b) includes a step of carrying out an etching process for the mesa structure.

11. The method for manufacturing an optical semiconductor device according to claim 8, wherein the angle to the principal surface of the substrate, of at least the part of the first side face is not less than 38° and not more than 78° and wherein the angle to the principal surface of the substrate, of the second side face is not less than 80° and not more than 115°.

12. The method for manufacturing an optical semiconductor device according to claim 8, further comprising forming a n-type block layer for burying the mesa structure, on the high-resistance semiconductor layer.

13. The method for manufacturing an optical semiconductor device according to claim 12, wherein the n-type block layer is composed of a n-type InP doped with sulfur.

14. The method for manufacturing an optical semiconductor device according to claim 10, wherein the etching process includes a dry etching process and a wet etching process, the wet etching process being performed after the dry etching process.

15. The optical semiconductor device according to claim 1, wherein the semiconductor structure further has an InGaAsP layer buried in the n-type cladding layer, the InGaAsP layer functioning as a diffraction grating, and the boundary between the first side face and the second face is positioned below the InGaAsP layer.

* * * * *